US006880967B2

(12) United States Patent
Isozumi et al.

(10) Patent No.: US 6,880,967 B2
(45) Date of Patent: Apr. 19, 2005

(54) REMAINING LIFETIME ESTIMATING METHOD, TEMPERATURE DETECTING STRUCTURE AND ELECTRONIC EQUIPMENT

(75) Inventors: Masashi Isozumi, Okayama (JP); Tsunetoshi Oba, Okayama (JP)

(73) Assignee: Omron Corporation, Kyoto (JP)

( * ) Notice: Subject to any disclaimer, the term of this patent is extended or adjusted under 35 U.S.C. 154(b) by 41 days.

(21) Appl. No.: 10/361,843

(22) Filed: Feb. 11, 2003

(65) Prior Publication Data

US 2003/0185271 A1 Oct. 2, 2003

(30) Foreign Application Priority Data

Feb. 21, 2002 (JP) ........................................ 2002-044630

(51) Int. Cl.[7] ................................................. G01K 3/04
(52) U.S. Cl. ...................................... 374/102; 324/548
(58) Field of Search ................................. 374/4, 43, 45, 374/57, 102, 163, 170; 324/537, 548

(56) References Cited

U.S. PATENT DOCUMENTS

| | | | |
|---|---|---|---|
| 3,950,985 A | | 4/1976 | Buchwald et al. |
| RE32,625 E | * | 3/1988 | Schwarz et al. ............... 374/57 |
| 5,019,760 A | * | 5/1991 | Chu et al. ..................... 374/102 |
| 5,700,089 A | * | 12/1997 | McKinnon ..................... 374/45 |
| 5,774,425 A | * | 6/1998 | Ivanov et al. ................. 374/102 |
| 6,276,222 B1 | * | 8/2001 | Miyamoto et al. ............. 73/866 |
| 6,532,421 B1 | * | 3/2003 | Miwa ............................ 702/34 |
| 6,564,165 B1 | * | 5/2003 | Mailloux et al. .............. 374/57 |
| 6,637,930 B1 | * | 10/2003 | Butchers et al. ............. 374/102 |
| 2004/0004994 A1 | * | 1/2004 | Wu et al. ..................... 374/170 |

FOREIGN PATENT DOCUMENTS

GB    2 361 064 A    10/2001

OTHER PUBLICATIONS

Patent Abstracts of Japan 63–281065, Nov. 17, 1988 (Toshiba Corp).
Patent Abstracts of Japan 01–260369, Oct. 17, 1989 (Mitsubishi Electric Corp).
Patent Abstracts of Japan 03–165270, Jul. 17, 1991 (Shimadzu Corp).
Patent Abstracts of Japan 03–202787, Sep. 4, 1991 (Nemitsuku Ramuda KK).
Patent Abstracts of Japan 03–269269, Nov. 29, 1991 (Hitachi Ltd & Hitachi Keiyo Eng Co Ltd).
Patent Abstracts of Japan 06–027175, Feb. 4, 1994 (Toyota Autom Loom Works Ltd).
Patent Abstracts of Japan 08–322141, Mar. 3, 1996 (Fuji Electric Co Ltd).

* cited by examiner

Primary Examiner—G. Bradley Bennett
(74) Attorney, Agent, or Firm—Foley & Lardner LLP

(57) ABSTRACT

A temperature of an electrolytic capacitor 24 incorporated in equipment is detected, a remaining lifetime in actual use is calculated based on a temperature-lifetime law, and the remaining lifetime is indicated. A thin film tape 23 is wound around a temperature sensor 22 for insulation, and the electrolytic capacitor 24 and the temperature sensor 22 are accommodated in a heat-shrinkable tube 25, the secondary temperature sensor 22 is brought into tight contact with the primary electrolytic capacitor 24.

26 Claims, 8 Drawing Sheets

Capacitor's capacity      $L_{rest}$

REMAINING LIFETIME ESTIMATING METHOD, TEMPERATURE DETECTING STRUCTURE AND ELECTRONIC EQUIPMENT

BACKGROUND OF THE INVENTION

1. Field of the Invention

The present invention relates to a method for estimating a remaining lifetime of a capacitor and the like, a temperature detecting structure suitable for the method, and various electronic equipment such as a power supply unit having such a capacitor.

2. Description of the Background Art

In electronic equipment of this kind, for example, a power supply unit, a lifetime of an electrolytic capacitor having the shortest lifetime among circuit components used for the power supply unit is estimated as a lifetime of the power supply unit.

It is known that the lifetime of the electrolytic capacitor can be calculated by the following arithmetic expression based on the Arrhenius law which is a law of temperature-lifetime showing a relation between a temperature and a lifetime:

$$Lx = Lo \times 2^{(To-tx)/10} \times k$$

Lx: estimated lifetime at the time of actual use (time)
Lo: warranty lifetime (time) at a maximum using temperature
To: maximum using temperature (° C.)
tx: actual using temperature (° C.)
k: lifetime coefficient Various equations for the lifetime coefficient k are proposed by capacitor makers, and the coefficient is a conversion coefficient obtained from applied voltage, ripple current, ambient temperature or the like.

Various estimating methods of lifetime based on such arithmetic expressions are conventionally proposed.

However, in the conventional technique, estimated lifetime is calculated using the arithmetic expression based on the Arrhenius law, actual operating time is subtracted from this estimated lifetime, and a result of this subtraction reaches a predetermined threshold value, it is judged that it is at the end of the lifetime, and an alarm is given. Therefore, the conventional technique can not inform a lifetime at the time of actual use.

Generally, exchange of electronic equipment used for various production equipment is incorporated in an annual schedule so that producing operation is not interfered. Therefore, the conventional technique in which an alarm informing that the electronic equipment is at the end of the lifetime is output or indicated suddenly one day can not be used easily. If the alarm informing that the equipment is at the end of the lifetime is output or indicated on a day other than a periodical maintenance term, there is a problem that the line must be stopped for exchanging the equipment.

Therefore, it is desired to estimate a remaining lifetime at the time of actual use, for example, to estimate remaining time during which the equipment can be operated.

Further, in order to precisely estimate a lifetime based on the Arrhenius law, it is necessary to precisely detect an actual using temperature (tx) of an electrolytic capacitor as apparent from the above arithmetic expression. A temperature sensor is provided for detecting the actual using temperature of the electrolytic capacitor, but since the detection is affected by convection of ambient air, it is not easy to precisely detect the temperature.

Especially in a power supply unit, a primary circuit and a secondary circuit are electrically insulated from each other by a transformer. The electrolytic capacitor whose lifetime is to be estimated is the primary circuit, but an arithmetic circuit such as a low-voltage operated microcomputer which calculates the lifetime based on a temperature detected by the temperature sensor is the secondary circuit. Therefore, it is more difficult to precisely detect a temperature of the electrolytic capacitor while keeping the insulation between the electrolytic capacitor and the temperature sensor.

SUMMARY OF THE INVENTION

The present invention has been accomplished in view of such circumstances, and it is a main object of the present invention to estimate a remaining lifetime at the time of actual use, and it is an object of the invention to provide a temperature detecting structure suitable for enhancing the estimating precision, and an electronic equipment capable of informing the remaining lifetime.

To achieve the above object, the present invention has the following structures.

That is, an estimating method of a remaining lifetime of a subject according to the present invention comprises a calculating step for calculating a remaining lifetime at a predetermined temperature in accordance with an arithmetic expression based on a temperature-lifetime law, and a converting step for converting the calculated remaining lifetime into a remaining lifetime in actual use.

According to the present invention, the remaining lifetime at the predetermined temperature is calculated in accordance with the arithmetic expression based on the temperature-lifetime law, and the result is converted into the remaining lifetime in actual use. Therefore, it is possible to estimate the remaining lifetime in actual use, and it is possible to grasp the exchanging time form this remaining lifetime, and to make a maintenance schedule.

According to an embodiment of the present invention, the calculating step and the converting step are carried out whenever a predetermined time is elapsed, in the calculating step, the predetermined time elapse in actual use is converted into an elapsed time at the predetermined temperature, and the converted value is subtracted from the remaining lifetime, the converting step is carried out based on a proportional relation between the remaining lifetime at the predetermined temperature and the remaining lifetime in actual use.

Here, "whenever a predetermined time is elapsed" means "whenever a constant time is elapsed", for example, this may mean constant time intervals or non-constant time intervals.

According to the present invention, if the predetermined time is elapsed, this elapsed time is converted into an elapsed time at the predetermined temperature, the converted value is subtracted from the remaining lifetime at the predetermined temperature, and the obtained remaining lifetime at the predetermined temperature is converted into the remaining lifetime in actual use using the proportional relation. Therefore, whenever the predetermined time is elapsed, it is possible to estimate the remaining lifetime at that time point.

In another embodiment of the present invention, in the calculating step, the conversion is carried out based on the temperature-lifetime law using a temperature at the time of actual use, in the conversion step, the calculated remaining lifetime is converted into the remaining lifetime in actual use based on a remaining lifetime at another time point at the predetermined temperature and an elapsed time in actual use corresponding to the other time point while using a total remaining lifetime at the initial stage at the predetermined temperature as a reference.

According to the present invention, if the predetermined time is elapsed, the elapsed time is converted into an elapsed time at the predetermined temperature based on the temperature-time law using the actual using temperature. Therefore, the conversion is carried out correctly even if the actual using temperature is changed from the predetermined temperature. Further, since the converted elapsed time is subtracted from the remaining lifetime at the predetermined temperature, the calculated remaining lifetime at the predetermined temperature is based on the past histories including the actual using temperature heretofore, and it is possible to precisely estimate the remaining lifetime. Further, since the conversion is carried out while using the initial total remaining lifetime at the predetermined temperature as the reference, it is possible to convert into the remaining lifetime in actual use precisely as compared with a case in which the remaining lifetime at a time point after the actual use is started is used as the reference.

In another embodiment of the present invention, the estimated subject of the remaining lifetime is a capacitor.

According to the present invention, since a remaining lifetime of the capacitor can be estimated, it is possible to estimate remaining lifetimes of various equipment having capacitors as a remaining lifetime of the capacitor.

In a structure for detecting a temperature of a capacitor according to the present invention, an insulating tape is wound around a temperature sensor which detects a temperature of the capacitor to bring the temperature sensor into tight contact with the capacitor.

According to the present invention, an extremely thin tape is commercially available as the insulating tape, even if such an insulating tape is wound, its thickness is extremely thin, it is possible to dispose the temperature sensor extremely close to the capacitor while ensuring a desired insulating performance, and it is possible to precisely detect a temperature of the capacitor.

In another embodiment of the present invention, the temperature around which the insulating tape is wound and the capacitor are accommodated in a heat-shrinkable tube and are integrally formed together.

According to the present invention, both the capacitor and the temperature sensor are integrally formed by the thermal shrinkage of the heat-shrinkable tube in a state in which both of them are in tight contact through the insulating tape, a temperature in the tube is equalized by heat conductivity of the heat-shrinkable tube, and a difference between the capacitor temperature and the temperature detected by the sensor is not generated almost at all. Thermal capacities become the same due to the integral formation, and a case in which a temperature of only the temperature sensor is abruptly varied due to outside air wind is not caused.

In another embodiment of the present invention, the capacitor is a primary circuit component which is insulated by a transformer, the temperature sensor is a part incorporated in a secondary circuit, the temperature sensor is connected to the secondary circuit through a lead wire.

According to the present invention, the desired insulation between the capacitor which is the primary circuit component and the temperature sensor incorporated in the secondary circuit can be ensured by winding the insulating tape. The temperature sensor which is disposed in tight contact with the capacitor must be connected to the secondary circuit, but since the temperature sensor is connected through the wiring pattern of the circuit substrate to which the primary circuit components including the capacitor are mounted, it is difficult to secure a distance necessary for insulation. Thereupon, using the lead wire, the wiring pattern spans the secondary the circuit substrate to the secondary circuit from above without laying on the circuit substrate, and the connection can be carried out while securing the desired insulating performance.

An electronic equipment having a capacitor of the present invention comprises a temperature sensor for detecting a temperature of the capacitor, calculating means for calculating a remaining lifetime of the capacitor using a detected temperature from the temperature sensor, and informing means for informing of the calculated remaining lifetime, and the calculating means includes a calculating section for calculating a remaining lifetime at a predetermined temperature in accordance with an arithmetic expression based on a capacitor temperature-lifetime law.

According to the present invention, the remaining lifetime at the predetermined temperature is calculated in accordance with the arithmetic expression based on the capacitor temperature-lifetime law using the detected temperature from the temperature sensor which detects the temperature of the capacitor. Since the remaining lifetime at the predetermined temperature and the remaining lifetime in actual use are proportional to each other, a ratio of the initial total remaining lifetime at the predetermined temperature to the remaining lifetime calculated in accordance with the arithmetic expression can be regarded as the ratio in actual use. It is possible to inform that what % the remaining lifetime occupies in the total lifetime (total remaining lifetime) for example, and based on this, it is possible to grasp the exchanging time and to make a maintenance schedule.

In another embodiment of the present invention, the calculating means calculates a remaining lifetime of the capacitor in actual use, the calculating means includes a converting section for converting the remaining lifetime at the predetermined temperature calculated by the calculating section into the remaining lifetime in actual use, the informing means indicates the calculated remaining lifetime.

According to the present invention, the remaining lifetime at the predetermined temperature is calculated in accordance with the arithmetic expression based on the capacitor temperature-lifetime law, and the result is converted into the remaining lifetime in actual use and the converted value is indicated. Therefore, it is possible to grasp the exchanging time from this remaining lifetime and to make a maintenance schedule.

In another embodiment of the present invention, the calculating means calculates a remaining lifetime of the capacitor in actual use whenever a predetermined time is elapsed, the calculating section converts the predetermined time elapse in actual use into an elapsed time at the predetermined temperature and subtracts the converted value from the remaining lifetime, the converting section converts based on a proportional relation between the remaining lifetime at the predetermined temperature and the remaining lifetime in actual use.

According to the present invention, if the predetermined time is elapsed, the elapsed time is converted into the elapsed time at the predetermined temperature, the converted value is subtracted from the remaining lifetime at the predetermined temperature, the obtained remaining lifetime at the predetermined temperature is converted into the remaining lifetime in actual use utilizing the proportional relation and the converted value is informed. Therefore, whenever the predetermined time is elapsed, a remaining lifetime at that time point can be informed.

In a preferred embodiment of the present the calculating section carries out the conversion based on a capacitor temperature-lifetime law using a detected temperature from the temperature sensor, the conversion section converts the calculated remaining lifetime into the remaining lifetime in actual use based on a remaining lifetime at another time point at the predetermined temperature and an elapsed time in actual use corresponding to the other time point while using a total remaining lifetime at the initial stage at the predetermined temperature as a reference.

According to the present invention, if the predetermined time is elapsed, the elapsed time is converted into an elapsed time at the predetermined temperature based on the capacitor temperature-lifetime law using the actual using temperature. Therefore, the conversion is carried out correctly even if the actual using temperature is changed from the predetermined temperature. Further, since the converted elapsed time is subtracted from the remaining lifetime at the predetermined temperature, the calculated remaining lifetime at the predetermined temperature is based on the past histories including the actual using temperature heretofore, and it is possible to precisely estimate the remaining lifetime. Further, since the conversion is carried out while using the initial total remaining lifetime at the predetermined temperature as the reference, it is possible to convert into the remaining lifetime in actual use precisely as compared with a case in which the remaining lifetime at a time point after the actual use is started is used as the reference.

In another embodiment of the present invention, the electronic equipment further comprises means for replacing the initial total remaining lifetime which is a reference of conversion in the converting section by a remaining lifetime at another time point.

According to the present invention, when the electronic equipment is used in an environment in which the temperature condition is largely changed, by replacing the conversion reference point by a time point after the temperature condition is changed, it is possible to precisely calculate the remaining lifetime.

In another embodiment of the present invention, the capacitor is a primary circuit component which is insulated by a transformer, the temperature sensor is a part incorporated in a secondary circuit, an insulating tape is wound around the temperature sensor, and the temperature sensor is brought into tight contact with the present capacitor.

According to the present invention, an extremely thin tape is commercially available as the insulating tape, even if such an insulating tape is wound, its thickness is extremely thin, it is possible to dispose the temperature sensor extremely close to the capacitor while ensuring a desired insulating performance between the primary capacitor and the secondary temperature sensor, and it is possible to precisely detect a temperature of the capacitor.

In another embodiment of the present invention, the temperature around which the insulating tape is wound and the capacitor are accommodated in a heat-shrinkable tube and are integrally formed together, the temperature sensor is connected to the calculating means through a lead wire.

According to the present invention, both the capacitor and the temperature sensor are integrally formed by the thermal shrinkage of the heat-shrinkable tube in a state in which both of them are in tight contact through the insulating tape, a temperature in the tube is equalized by heat conductivity of the heat-shrinkable tube, and a difference between the capacitor temperature and the temperature detected by the sensor is not generated almost at all. Thermal capacities become the same due to the integral formation, and a case in which a temperature of only the temperature sensor is abruptly varied due to outside air wind is not caused. The temperature sensor which is disposed in tight contact with the capacitor is connected to the secondary circuit, but since the temperature sensor is connected through the wiring pattern of the circuit substrate to which the primary circuit components including the capacitor are mounted, it is difficult to secure a distance necessary for insulation. Thereupon, using the lead wire, the wiring pattern spans the secondary the circuit substrate to the secondary circuit from above without laying on the circuit substrate, and the connection can be carried out while securing the desired insulating performance.

In a preferable embodiment of the present invention, the informing means can switch indication manners of the calculated remaining lifetime between character indication and numerical value indication.

According to the present invention, when a time period during which the lifetime is elapsed is excessively long, if the time period is indicated with characters, it is possible to roughly grasp the deterioration degree. If the time period during which the lifetime is elapsed is shortened, the indication manner is switched to the numerical value indication so that the indication can effectively be utilized for management.

In another embodiment of the present invention, the calculating means includes a deterioration degree calculating section for calculating a rate of the remaining lifetime at the predetermined temperature calculated by the calculating section to the initial total remaining lifetime at the predetermined temperature, the informing means indicate the calculated deterioration degree.

According to the present invention, the indication manner of the calculated remaining lifetime is not limited to the numerical value indication on the basis of years, months, or hours, and it is possible to indicate that what percent the electronic equipment is used and deteriorated in the total lifetime (total remaining lifetime), and it is possible to manage the exchanging time based on the deterioration degree.

DESCRIPTION OF THE PREFERRED EMBODIMENTS

An embodiment of the present invention will be explained below based on the drawings.

Figure 1:
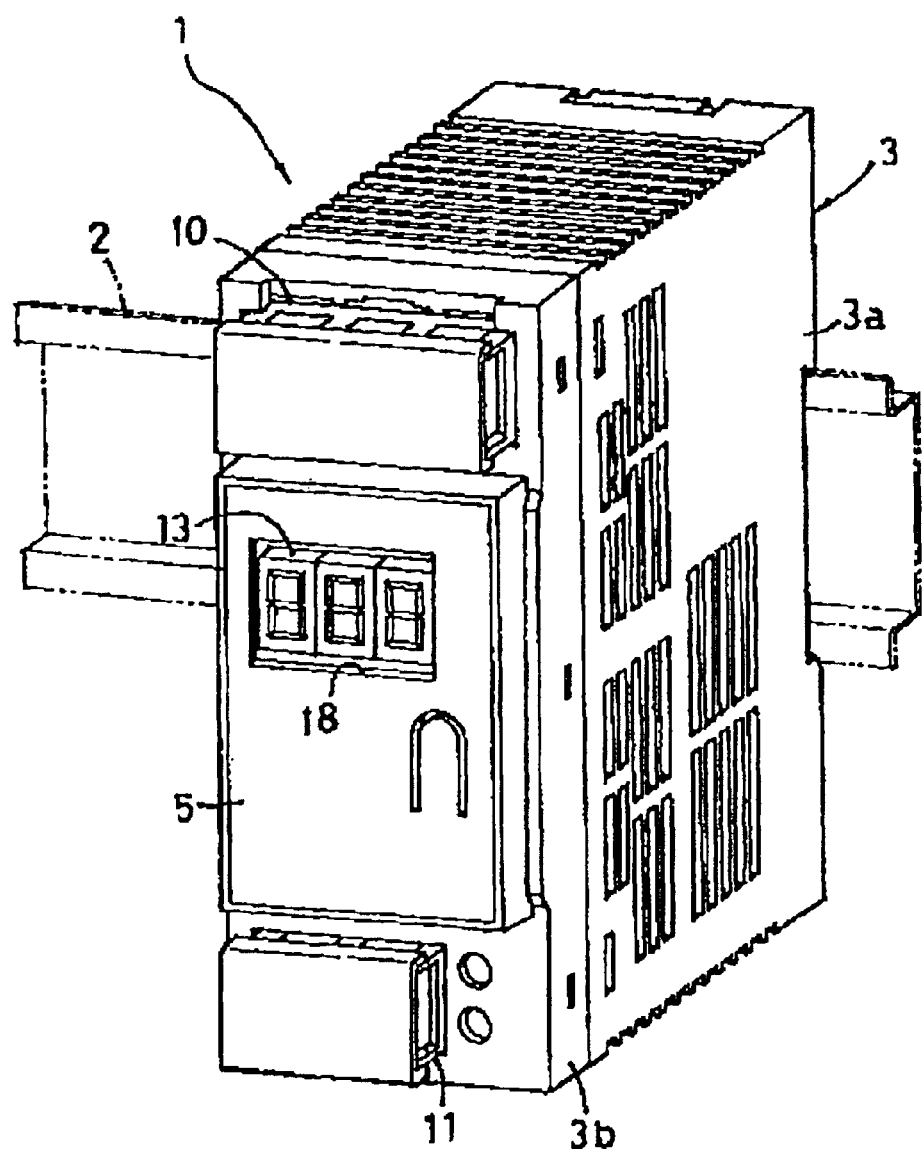
FIG. 1 is a perspective view of an entire power supply unit according to one embodiment of the present invention.
Figure 2:
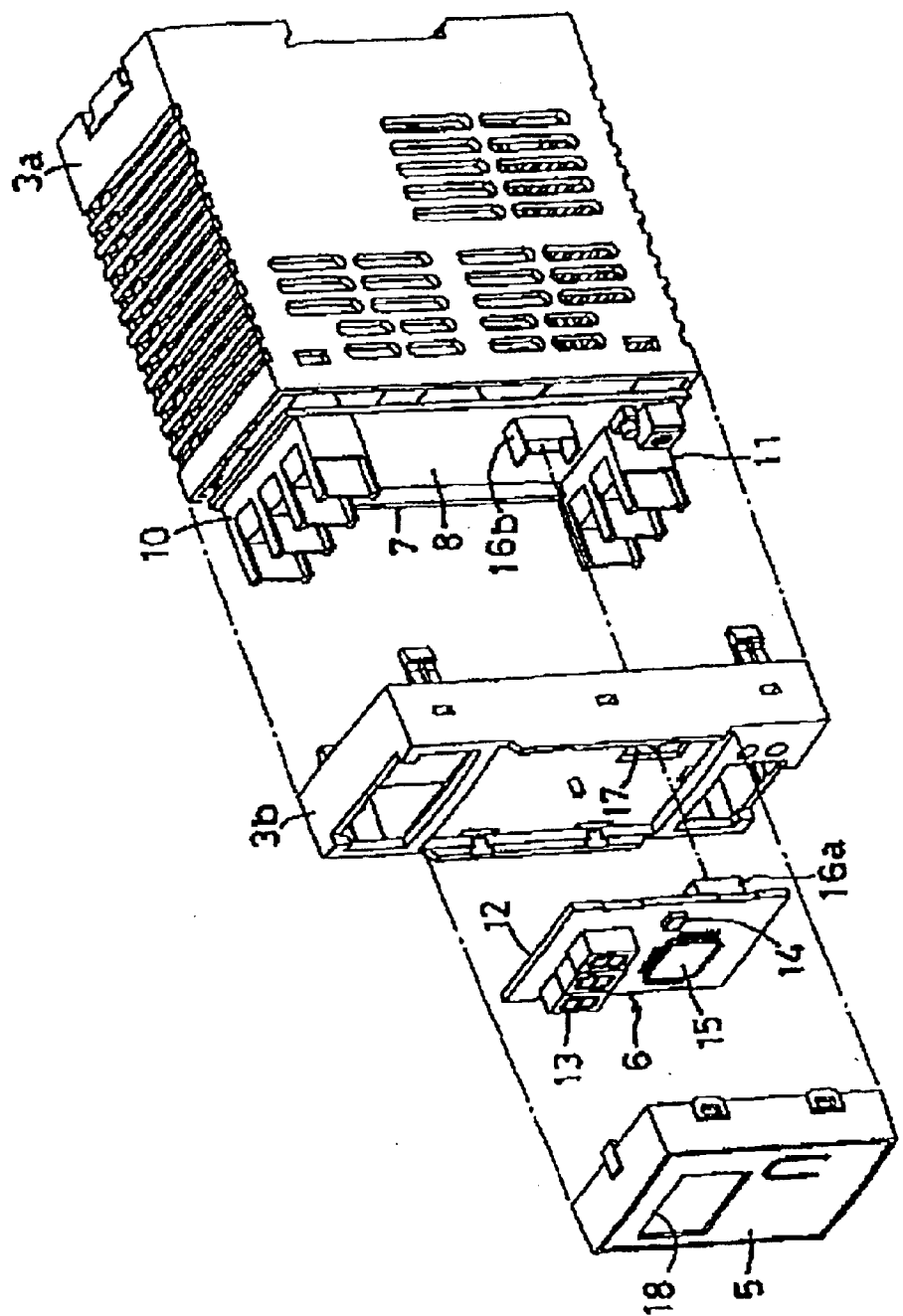
FIG. 2 is an exploded perspective view of the power supply unit shown in FIG. 1.
Figure 3:
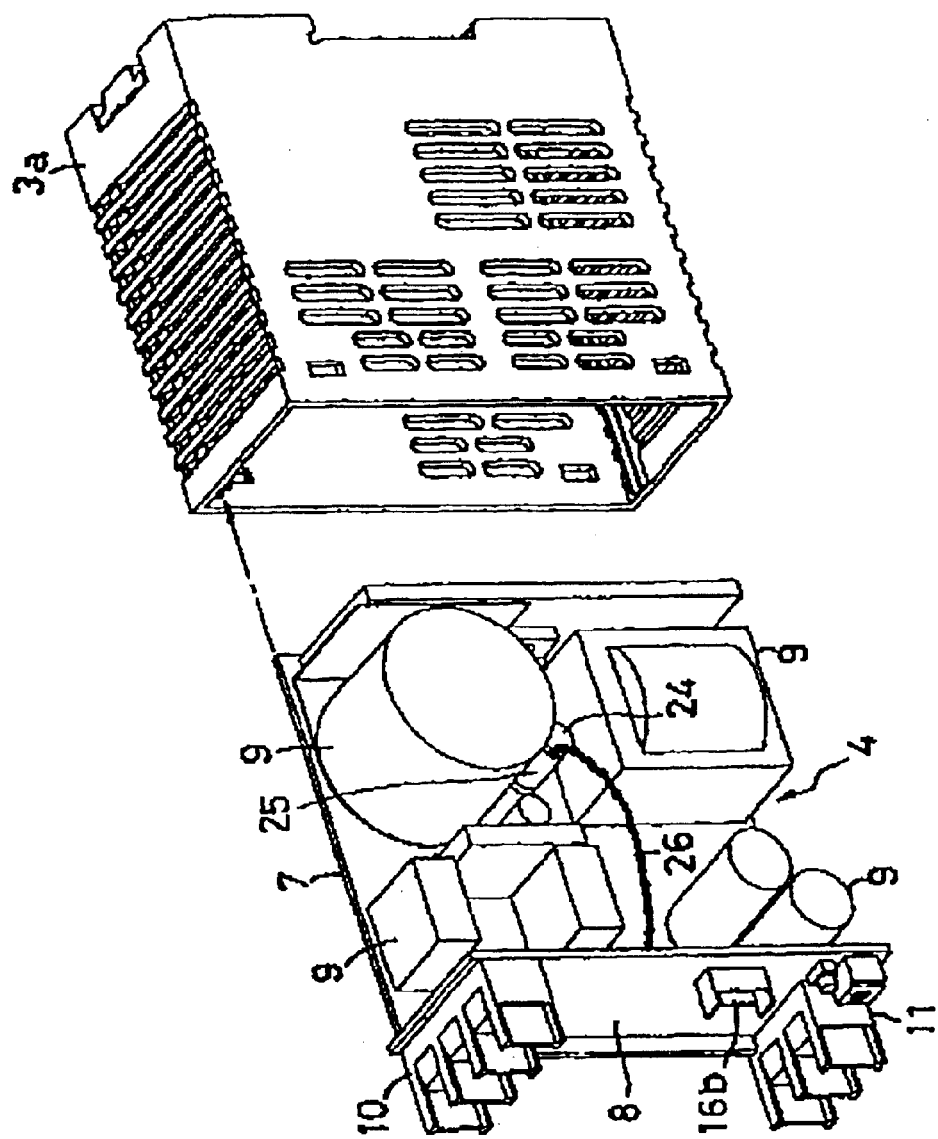
FIG. 3 is an exploded perspective view of the power supply unit shown in FIG. 1.
Figure 4:
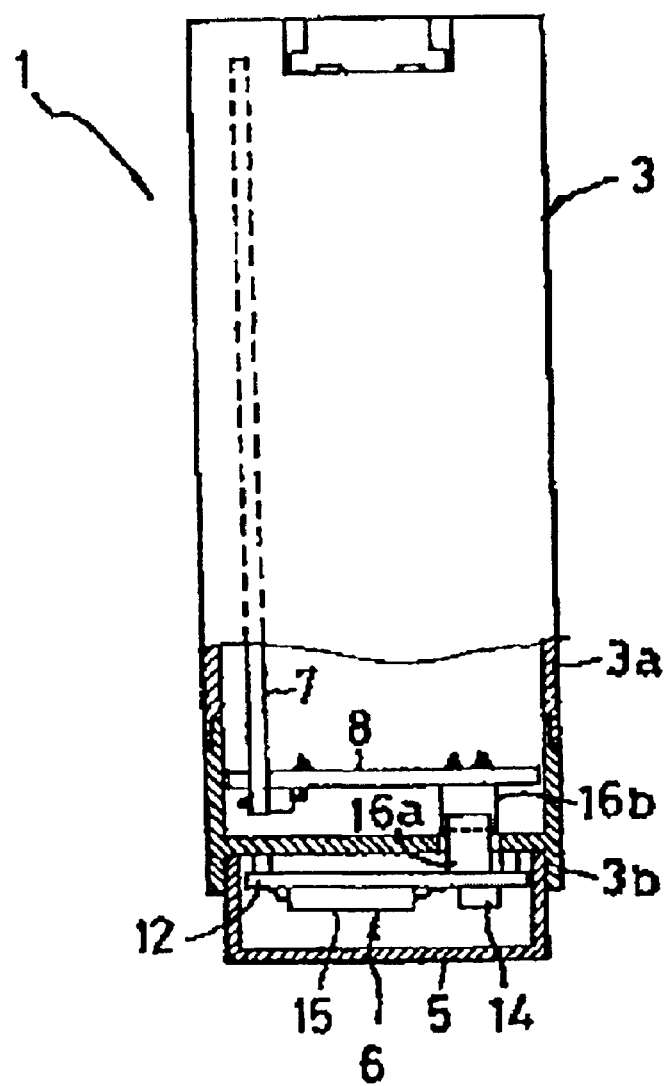
FIG. 4 is a plan view partly in section of the power supply unit shown in FIG. 1.

FIG. 1 is a perspective view of an entire power supply unit according to the present invention. FIGS. 2 and 3 are exploded perspective views thereof. FIG. 4 is a plan view partly in section thereof.

This power supply unit 1 is formed into a box-like unit which is detachably mounted on a front surface a supporting rail 2 such as a DIN rail. The supporting rail 2 is laterally fix to power supply equipment. A casing 3 of the power supply unit 1 comprises a box-like resin case body 3a and a resin front cover 3b. The case body 3a has a large horizontal depth, its front surface is opened. The front cover 3b is engaged with and connected to the front surface. A power supply circuit unit 4 shown in FIG. 3 is incorporated and supported in the casing 3.

A shallow box-like resin auxiliary case 5 whose rear surface is opened is detachably engaged with and connected to the front surface of the casing 3, for example, a vertically intermediate portion of a front wall of the front cover 3b. An arithmetic circuit unit 6 for calculating a remaining lifetime in a later-described manner is incorporated and supported in a space formed between the front cover 3b and the auxiliary case 5.

The power supply circuit unit 4 includes, as a substrate for the power supply circuit, a main substrate 7 facing left and right sides, and a front substrate 8 connected to a front portion of the main substrate 7 such as to face front and rear sides. Various electronic components 9 constituting the power supply circuit is mounted to the main substrate 7. An input terminal blocks 10 and 11 are mounted to the front substrate 8. A terminal screw is not illustrated.

The arithmetic circuit unit 6 includes an auxiliary substrate 12 supported by a front surface of the front cover 3b in parallel as an arithmetic circuit substrate. Mounted to the auxiliary substrate 12 are an LED indicator 13 as informing means for indicating and informing a remaining lifetime, a voltage set value, an output voltage present value, an output current present value, a peak present value and the like, a mode switch 14 for switching indication modes, a CPU 15 and the like. A connector 16a mounted to a back surface of the auxiliary substrate 12 of the arithmetic circuit unit 6 and a connector 16b mounted to the front substrate 8 of the power supply circuit unit 4 are connected to each other through an opening 17 formed in the front cover 3b so that the power supply circuit unit 4 and the arithmetic circuit unit 6 are electrically connected to each other.

According to the above structure, the front cover 3b which is a front wall of the casing 3 functions as a heat-insulating partition wall for insulating the power supply circuit unit 4 and the arithmetic circuit unit 6 from each other, and the front cover 3b effectively insulate heat from the power supply circuit unit 4.

Figure 5:
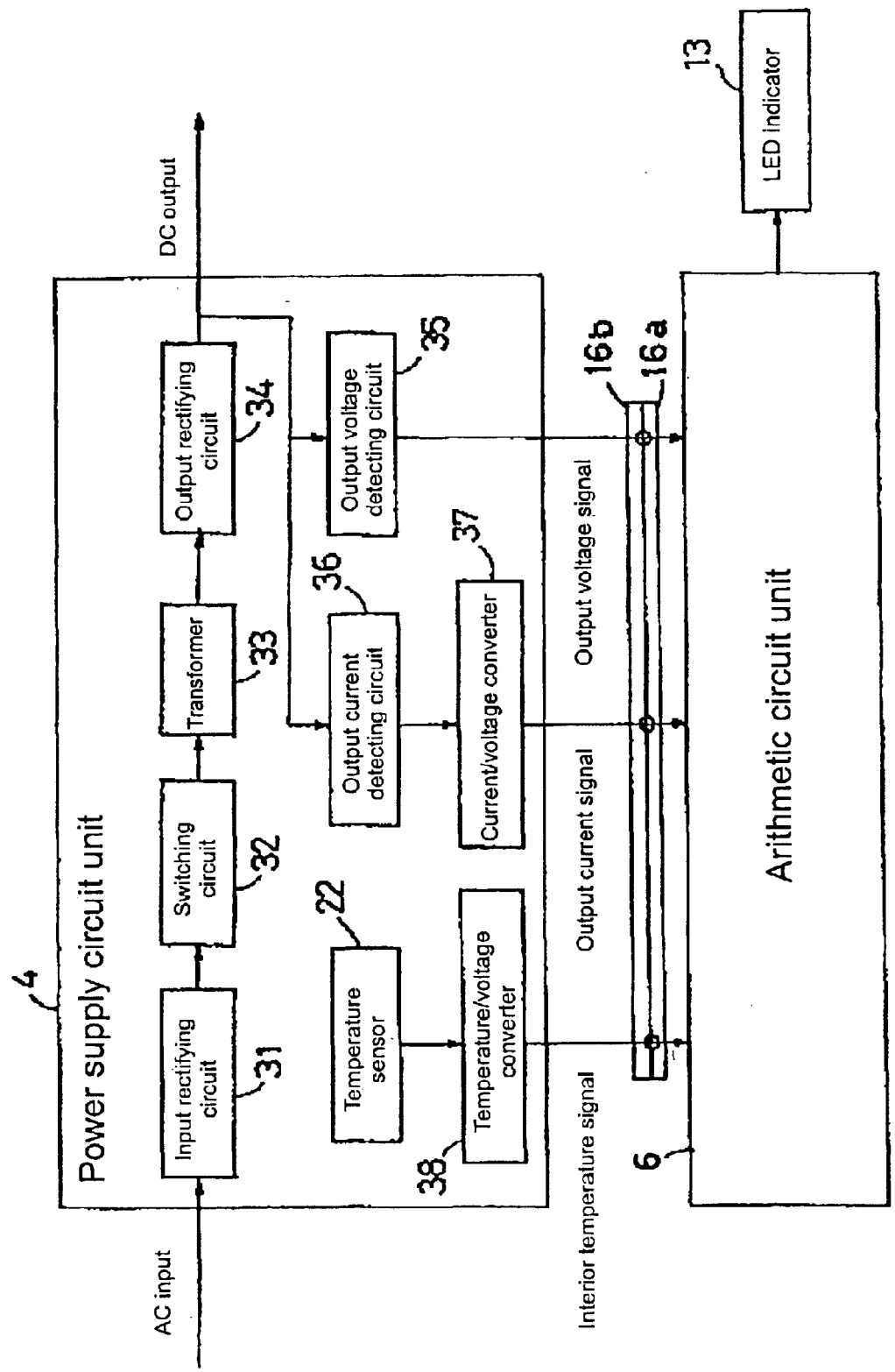
FIG. 5 is a block diagram showing an outline structure of the power supply unit.

FIG. 5 is a block diagram of the power supply unit 1 of this embodiment.

The power supply circuit unit 4 comprises an input rectifying circuit 31 for rectifying and smoothening an AC input, a switching circuit 32 having a switching element such as an FET, a transformer 33 for converting an input into a predetermined output in accordance with on/off operation of the switching element, and an output rectifying circuit 34 for rectifying an output from the transformer 33. This structure is basically the same as that of the conventional technique.

This embodiment includes an output voltage detecting circuit 35, an output current detecting circuit 36 and a current/voltage converter 37 for indicating an output voltage value, an output current value, a peak present value and the like on the LED indicator 13. Outputs of the output voltage detecting circuit 35, the current/voltage converter 37 are sent to the arithmetic circuit unit 6 through the connectors 16a and 16b. The arithmetic circuit unit 6 includes an operational amplifier, an A/D converter (both not shown) and the CPU 15.

In this embodiment, in order to make it possible to grasp the exchanging time of the power supply unit 1, a remaining lifetime of an electrolytic capacitor 24 shown in FIG. 3 which is the primary circuit component insulated by the transformer 33 is calculated in accordance with the arithmetic expression based on the Arrhenius law by the arithmetic circuit unit 6 as will be explained later, and the remaining lifetime is indicated on the LED indicator 13.

In order to calculate the lifetime of the electrolytic capacitor 24 based on the Arrhenius law, it is necessary to detect a temperature of the electrolytic capacitor 24. In order to calculate the remaining lifetime precisely, it is necessary to precisely detect the temperature of the electrolytic capacitor 24.

In this case, the electrolytic capacitor 24 is a primary circuit component, and a temperature sensor for detecting the temperature of the electrolytic capacitor 24 is connected to the arithmetic circuit unit 6 which is a secondary circuit. Thus, it is necessary to reliably insulate the electrolytic capacitor 24 and the temperature sensor from each other. According to IEC 60950 which is a typical safety standard, in order to insulate the primary circuit and the secondary circuit, it is necessary to ensure a spatial distance of 4 mm, a creeping distance of 5 mm, and solid insulation distance of 0.4 mm. Whereas, in order to precisely detect the temperature of the electrolytic capacitor 24, it is desirable to set the temperature sensor closer to the electrolytic capacitor 24 as close as possible.

Thereupon, in this embodiment, the following temperature detecting structure is proposed.

Figure 6A:
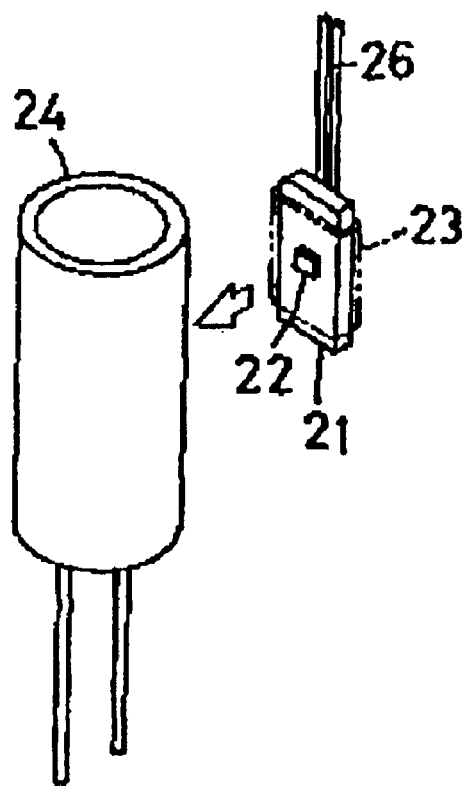
FIGS. 6A, 6B and 6C are explanatory views of a temperature detecting structure of an electrolytic capacitor.
Figure 6B:
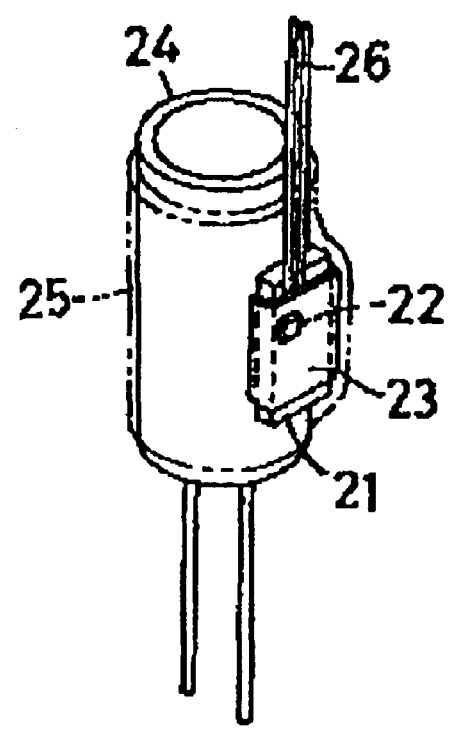
Figure 6C:
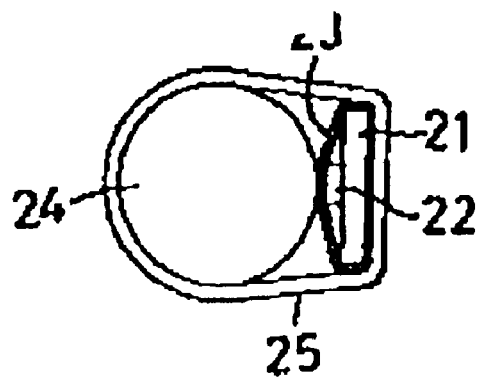

That is, as shown in FIG. 6, a thermister mounted to a small sensor substrate 21 is used as a temperature sensor 22 which detects a temperature of the electrolytic capacitor 24. An insulating thin film tape 23 is wound around the temperature sensor 22 and the sensor substrate 21 in two or more layers. In this embodiment, a polyester thin film tape having a thickness of 0.025 mm is wound in three layers so as to satisfy the thin film insulation standard.

Further, the temperature sensor 22 and the sensor substrate 21 coated with the thin film tape 23 in an insulating manner are put in a heat-shrinkable tube 25 in a state in which they abut against an outer peripheral surface of the electrolytic capacitor 24, and the heat-shrinkable tube 25 is shrank by heat, thereby bringing the temperature sensor 22 into tight contact with the electrolytic capacitor 24 through the thin insulating layer. As a material of the heat-shrinkable tube 25, it is possible to use polyolefin resin, fluorine-based polymer or thermoplastic elastomer.

By insulating and coating the temperature sensor 22 and the sensor substrate 21 with the thin film tape 23, the temperature sensor 22 could be disposed extremely close to the electrolytic capacitor 24 while satisfying a desired insulating performance, for example, the thin film insulation standard. Since the thickness of the thin film tape 23 is 0.025 mm as described above, a thickness of the three times wound thin film tape 23 is 0.075 mm, this value is extremely smaller than the necessary distance of 0.4 mm of the solid insulation determined by the IEC 60950, and influence of thermal insulation by the thin film tape 23 can be reduced extremely.

The electrolytic capacitor 24, the temperature sensor 22 and the sensor substrate 21 are integrally formed using the heat-shrinkable tube 25. Therefore, adhesion between the electrolytic capacitor 24 and the temperature sensor 22 is enhanced, a temperature in the tube is equalized by thermal conduction of the heat-shrinkable tube 25, and a difference between the electrolytic capacitor temperature and the temperature detected by the sensor is not generated almost at all. Thermal capacities become the same due to the integral formation because the electrolytic capacitor 24, the temperature sensor 22 and the sensor substrate 21 are integrally formed using the heat-shrinkable tube 25. Therefore, a case in which a temperature of only the temperature sensor 22 is abruptly varied due to outside air wind is not caused.

A thickness and a width of the thin film tape 23, and a length of the heat-shrinkable tube 25 are not limited to those shown in FIG. 6, and it is of course possible to appropriately select such values.

Further, in this embodiment, a lead wire 26 extending from the sensor substrate 21 is connected to the front substrate 8 such as to span the main substrate 7 from above as shown in FIG. 3, and an output detected by the temperature sensor 22 is sent to the arithmetic circuit unit 6 through a temperature/voltage converter 38 and the connectors 16a and 16b as shown in FIG. 5. With this structure, the output detected by the temperature sensor 22 can be sent to the arithmetic circuit unit 6 without using a wiring pattern of the main substrate 7 on which the primary circuit components including the electrolytic capacitor 24 are mounted.

Next, a calculating method of a remaining lifetime of the electrolytic capacitor 24 in the arithmetic circuit unit 6 will be explained in detail.

It is known that the lifetime of the electrolytic capacitor can be calculated by the following arithmetic expression based on the Arrhenius law as described above:

$$Lx = Lo \times 2^{(To-tx)/10} \times k \qquad (1)$$

Lx: estimated lifetime at the time of actual use (time)
Lo: warranty lifetime (time) at a maximum using temperature
To: maximum using temperature (° C.)
tx: actual using temperature (° C.)
k: lifetime coefficient In this embodiment, a temperature $t_0$ ° C. of the electrolytic capacitor 24 expected under a standard using condition, for example, is first determined, and an initial total remaining lifetime $L_0$ of the given temperature $t_0$ ° C. is calculated using the above equation (1).
That is, $L_0 = Lo \times 2^{(To-t0)/10} \times k$.

Next, when the actual use of the power supply unit 1 is started, whenever constant time a, for example, 1/60hours (1 minute) is elapsed, a remaining lifetime at the given temperature $t_0$ ° C. is calculated by the following equation which is an arithmetic expression based on the Arrhenius law:

$$L_n = L_{n-1} - a \times 2^{(tx-t0)/10} \times k \qquad (2)$$

wherein n=1, 2, 3 . . . , and tx is an average temperature (° C.) detected by the temperature sensor 22 at a predetermined constant time a.

As shown in this equation (2), the remaining lifetime $L_0$ which is calculated whenever the constant time a is elapsed becomes smaller than a remaining lifetime $L_{n-1}$ which is calculated last time, and the remaining lifetime is gradually reduced.

In this equation (2), the second term of the right side, for example, $a \times 2^{(tx-t0)/10} \times k$ is obtained by converting an elapsed constant time a at the detected actual using temperature tx into an elapsed time at the predetermined temperature $t_0$. For example, when the detected actual using temperature tx is equal to the predetermined temperature $t_0$, the second term becomes a if the lifetime coefficient k is ignored, and the second term coincides with the elapsed time a in the actual use. When the detected actual using temperature tx is higher than the predetermined temperature $t_0$ by 10° C., the second term becomes 2a, a value of the second term becomes double of the elapsed time a at the actual using temperature. When the detected actual using temperature tx is lower than the predetermined temperature to by 10° C., the second term becomes a/2, and a value of the second term becomes ½ of the elapsed time a at the actual using temperature.

Every constant time a, the constant time a is converted into the elapsed time at the predetermined temperature to based on the Arrhenius law using the actual using temperature tx detected during the constant time, and the converted value is subtracted from the last remaining lifetime $L_{n-1}$, and this value is defined as a remaining lifetime $L_n$ at the current predetermined temperature $t_0$.

Therefore, the remaining lifetime $L_n$ at the calculated predetermined temperature $t_0$ is based on the entire past histories including the temperature tx and the lifetime coefficient k in the actual use heretofore, and it is possible to precisely estimate the remaining lifetime.

Figure 7:
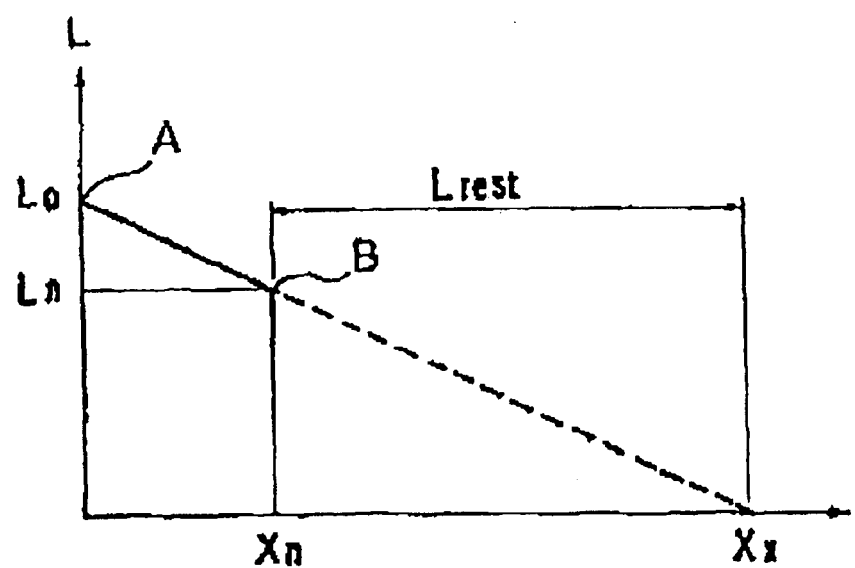
FIG. 7 is a view for explaining calculation of a remaining lifetime.

The remaining lifetime $L_n$ at the predetermined temperature $t_0$ which is calculated in this manner is converted into a remaining lifetime in the actual use in the following manner:

FIG. 7 is a view for explaining this conversion. The vertical axis in FIG. 7 shows a remaining lifetime at a predetermined temperature $t_0$, and shows a total remaining lifetime (total lifetime) $L_0$ at the initial stage, and a remaining lifetime Ln at a certain time point. A lateral axis corresponds to a remaining lifetime in the actual use, and shows an elapsed time Xn at the actual use up to certain time point, and an elapsed time Xx in the actual use until it comes to an end of the lifetime.

As described above, whenever the constant time a is elapsed, the remaining lifetime $L_n$ at the predetermined temperature to is calculated, and an elapsed time from the start of operation is added up every constant time a. FIG. 7 shows that Xn time is elapsed from the instant when the operation is started to the certain instant when the remaining lifetime $L_n$ is calculated.

In this embodiment, utilizing a fact that a remaining lifetime at the predetermined temperature $t_o$ and a remaining lifetime in the actual use are substantially in proportional to each other, a straight line connecting a point A of a total remaining lifetime $L_0$ at the initial stage of the vertical axis and a point B of intersection between a remaining lifetime $L_n$ at a certain time point and an elapsed time Xn in actual use up to said certain time point is defined as an elapsed time Xx until it comes to an end of the lifetime.

Therefore, a remaining lifetime Lrest at said certain time point n can be calculated by the following equation:

$$Lrest = Xx - Xn = \{L_n/(L_0 - L_n)\} \times Xn \qquad (3)$$

That is, the remaining lifetime Lrest in the actual use is calculated from the total remaining lifetime $L_0$ at the initial stage, the remaining lifetime $L_n$ at the predetermined temperature $t_0$ which is calculated whenever the constant time a is elapsed, and the elapsed time Xn from the start of operation to that time point.

However, since there is an adverse possibility that the inclination of the straight line is largely varied at the initial stage of the start of operation, if the Xx becomes equal to or greater than a predetermined Xmax (Xx≧Xmax), Xx is set to Xmax.

The remaining lifetime Lrest in the actual use calculated in this manner may be indicated with numerical values on the basis of years, months, days or hours, but a lifetime of an electrolytic capacitor is generally from several years to a dozen years. Therefore, if the remaining lifetime Lrest is indicated with numerical values from the initial stage of start of operation, since there is too much time until the electrolytic capacitor comes to its end of remaining lifetime, this is not effectively,used. Further, since the variation in inclination of the above straight line is increased as the elapsed time Xn from the start of operation is shorter, the variation in the calculated remaining lifetime Lrest in actual use is also increased.

Figure 8:
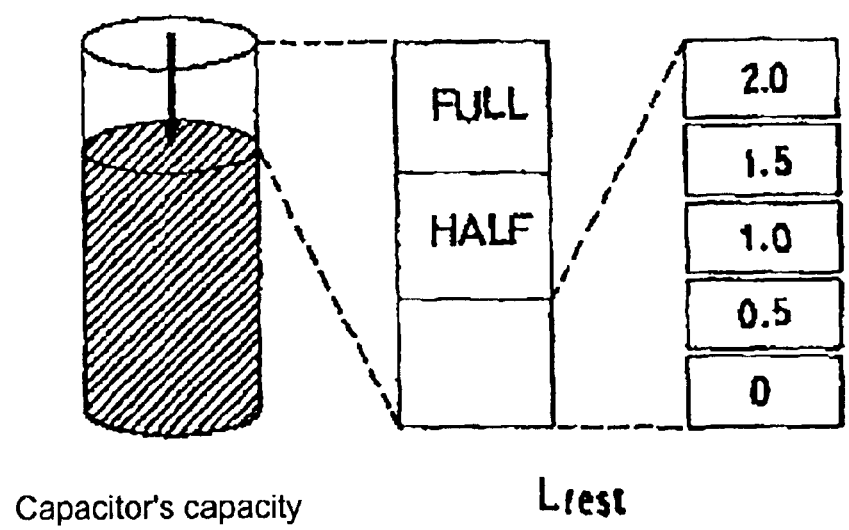
FIG. 8 is an explanatory view for showing, in a simulation manner, a switching operation of indicating timing.

Thereupon, in this embodiment, the calculate remaining lifetime Lrest in the actual use is indicated in the following manner:

That is, FIG. 8 shows, in a simulation manner, a switching operation of indicating timing when a remaining lifetime of an electrolytic capacitor is indicated.

Since a lifetime of an electrolytic capacitor is determined as being elapsed when its initial lifetime is reduced by 20 to 30%. Therefore, after the calculated remaining lifetime Lrest in the actual use becomes equal to or lower than a constant value (two years in this example), the lifetime is indicated with numerical values, a time period required from the initial value to the instant when the indication manner is changed to the year-base indication of numerical values is equally divided and indicated on the LED indicator 13 using characters such as "FULL" and "HALF". More specifically, the remaining lifetime is indicated on the LED indicator 13 with characters such as "FULL" and "HALF" or with year-base numerical values such as "2.0y".

Figure 9:
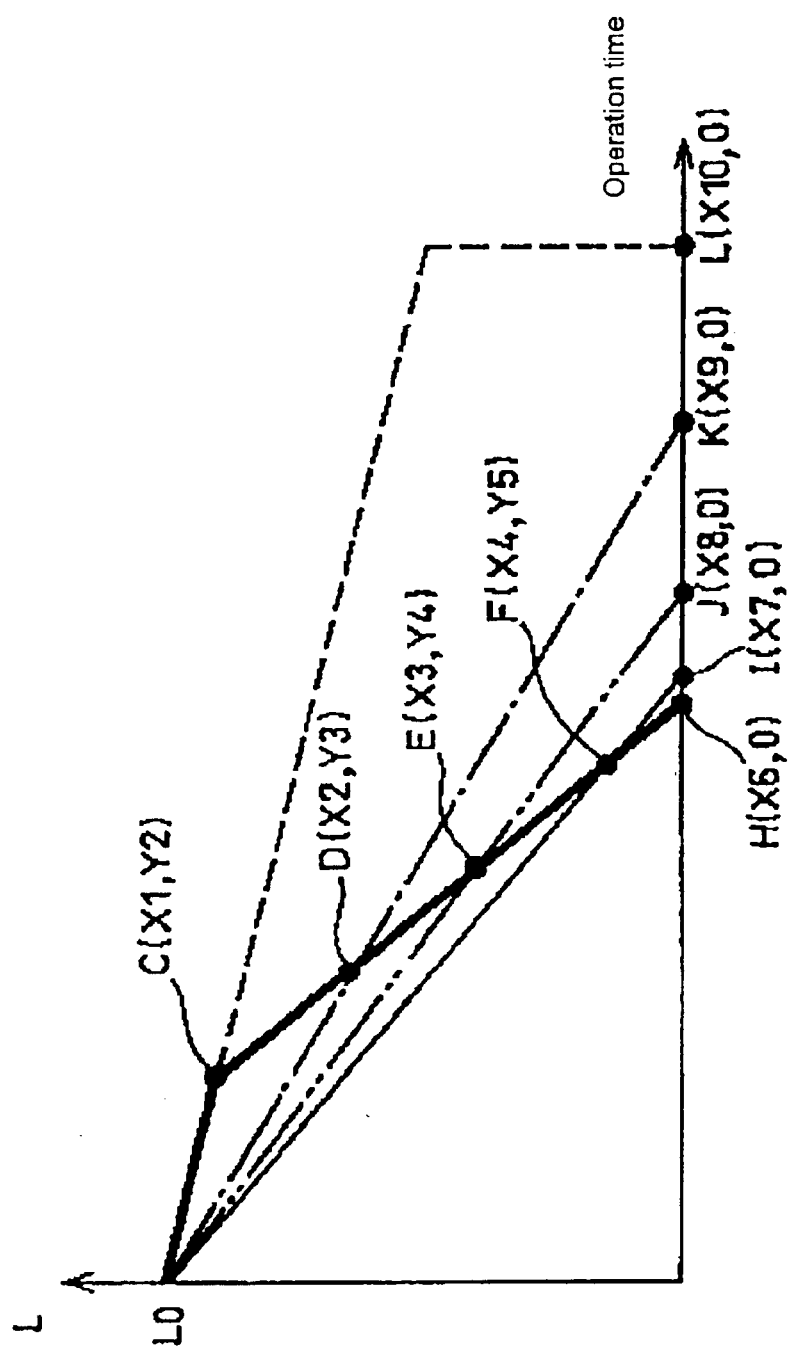
FIG. 9 is a view for explaining a reset function.

In this embodiment, when the using conditions such as a temperature and a load are largely varied due to change of equipment or the like and the inclination of the straight line in FIG. 7 is largely varied in partway, a remaining lifetime can be expected precisely in accordance with such variation in the following manner:

FIG. 9 corresponds to FIG. 7, and in FIG. 9, an elapsed time in the actual use of the lateral axis at each time point is indicated with the X coordinate, and a remaining lifetime at a predetermined temperature of the vertical axis is indicated with the Y coordinate.

A remaining lifetime Lrest in the actual use at a C time point (X1, Y2) at which X1 hour is elapsed from the start of operation is limited by a lifetime limit as shown with a broken line and thus, is X10–X1. Here, X10 corresponds to the above-described Xmax which is the lifetime limit determined in view of physical properties of the electrolytic capacitor. A remaining lifetime Lrest at a D time point (X2, Y3) at which the actual using temperature tx is increased and the inclination is changed after the C time point (X1, Y2) is X9–X2 as shown with a dashed line. Basically, a real remaining lifetime Lrest should be X6–X2 of a point (x6, 0) of intersection of the straight line and the lateral axis shown with a solid line which is a new inclination.

The above-described equation (3) is calculated while defining a point of a total remaining lifetime $L_0$ at the initial time point as a reference assuming that the inclination of the straight line in the elapsed time Xn from the start of operation to the n time point is constant. For this reason, if the inclination is changed in partly, an error is adversely generated. However, this error is corrected and solved with time. For example, a remaining lifetime Lrest at E time point is X8–X3 as shown with a phantom line, a remaining lifetime Lrest at F time point (X4, Y5) is X7–X4 as shown with a thin solid line, an error with respect to a real remaining lifetime Lrest is small and corrected, and in the vicinity of H time point (X6, 0) at which the remaining lifetime Lrest becomes substantially equal to 0 (Lrest≈0), the error is solved.

On the other hand, at C time point (X1 Y2) at which the inclination is changed, if X1 is rest to 0 and L0 is rest to Y2, since a point (0, $L_0$) of the reference initial total remaining lifetime $L_0$ is replaced by C time point (X1, Y2), and it is possible to prevent an error from being generated.

Thereupon, in this embodiment, when the using conditions such as a temperature and a load are largely varied due to change of equipment or the like, reset is carried out by a switch or an external signal at that time point, the reference point is replaced and a remaining lifetime having no error is indicated.

In this embodiment, it is also possible to calculate how much the present lifetime is reduced as compared with the total remaining lifetime $L_0$ at the initial stage, for example, how much the device is deteriorated, and a result can be indicated with a deterioration degree E (%) by the following equation:

$$E=(L_n/L_0)\times 100$$

Since the inclination of the straight line shown in FIG. 7 is different depending upon a value (high or low) of the actual using temperature tx, the deterioration degree E is different even when the remaining lifetime Lrest is the same. Therefore, when the exchanging time should be determined while using a constant remaining margin as a Preference, it is effective to indicate the remaining lifetime using this deterioration degree.

Another Embodiment

In the previous embodiment, the remaining lifetime is calculated every predetermined constant time. As the other embodiment of the present invention, the remaining lifetime may be calculated and indicated in response to the operation.

Although the point of intersection between the lateral axis and the straight line connecting two points is defined as the elapsed time Xx in the above embodiment, the straight line is not limited to one connecting the two points, and the straight line may be obtained by a method of least squares using three or more points.

According to the present invention as explained above, a remaining lifetime at a predetermined temperature is calculated in accordance with the arithmetic expression based on the temperature-lifetime law, the remaining lifetime is converted into a remaining lifetime in the actual use and is informed. Therefore, it is possible to grasp the exchanging time from this remaining lifetime and to make a maintenance schedule. Thus, a case in which the equipment suddenly comes to the end of its remaining lifetime and the line of the equipment is stopped can be avoided unlike the conventional technique which informs of the end of lifetime. This is especially effective to grasp the exchanging time of various electronic equipment such as a power supply unit having a capacitor.

Further, according to the invention, a thin insulating tape is round around a temperature sensor, the temperature sensor can be disposed in close contact with the capacitor while ensuring the insulation, and a temperature can be detected precisely. Since the temperature sensor and the electrolytic capacitor are integrally formed together using a heat-shrinkable tube, a case in which a temperature of only the temperature sensor is abruptly varied due to outside air wind is not caused, and it is possible to precisely detect a temperature and thus it is possible to precisely calculate a remaining lifetime.

What is claimed is:

1. An estimating method of a remaining lifetime of a subject, comprising:

calculating the remaining lifetime at a predetermined temperature in accordance with an arithmetic expression based on a temperature-lifetime law, and converting the calculated remaining lifetime into a remaining lifetime in actual use.

2. The estimating method of a remaining lifetime according to claim 1, wherein:

said calculating step and said converting step are carried out whenever a predetermined time is elapsed, in said calculating step, said predetermined time elapse in actual use is converted into an elapsed time at said predetermined temperature, and the converted value is subtracted from the remaining lifetime, and said converting step is carried out based on a proportional relation between the remaining lifetime at said predetermined temperature and the remaining lifetime in actual use.

3. The estimating method of a remaining lifetime according to claim 2, wherein:

in said calculating step, said conversion is carried out based on the temperature-lifetime law using a temperature at the time of actual use, and in said conversion step, the calculated remaining lifetime is converted into the remaining lifetime in actual use based on a remaining lifetime at another time point at said predetermined temperature and an elapsed time in actual use corresponding to said other time point while using a total remaining lifetime at the initial stage at said predetermined temperature as a reference.

4. The estimating method of a remaining lifetime according to claim 1, wherein said subject is a capacitor.

5. A structure for detecting a temperature of a capacitor wherein an insulating tape is wound around a temperature sensor which detects a temperature of said capacitor to bring said temperature sensor into tight contact with said capacitor.

6. A structure for detecting a temperature according to claim 5, wherein said temperature sensor around which said insulating tape is wound and said capacitor are accommodated in a heat-shrinkable tube and are integrally formed together.

7. A structure for detecting temperature according to claim 5, wherein said capacitor is a primary circuit component which is insulated by a transformer, said temperature sensor is a part incorporated in a secondary circuit, said temperature sensor is connected to said secondary circuit through a lead wire.

8. An electronic equipment having a capacitor, comprising:

a temperature sensor for detecting a temperature of said capacitor, calculating means for calculating a remaining lifetime of said capacitor using a detected temperature from said temperature sensor, converting means for converting the calculated remaining lifetime into a remaining lifetime in actual use, and informing means for informing of the calculated remaining lifetime, wherein said calculating means includes a calculating section for calculating the remaining lifetime at a predetermined temperature in accordance with an arithmetic expression based on a capacitor temperature-lifetime law.

9. The electronic equipment according to claim 8, wherein:

said calculating means calculates the remaining lifetime of said capacitor in actual use, said converting means includes a converting section for converting the remaining lifetime at the predetermined temperature calculated by said calculating section into the remaining lifetime in actual use, and said informing means indicates the calculated remaining lifetime.

10. The electronic equipment according to claim 9, wherein:

said calculating means calculates the remaining lifetime of said capacitor in actual use whenever a predetermined time is elapsed, said calculating section converts said predetermined time elapse in actual use into an elapsed time at said predetermined temperature and subtracts the converted value from the remaining lifetime, and said converting section converts based on a proportional relation between the remaining lifetime at said predetermined temperature and the remaining lifetime in actual use.

11. The electronic equipment according to claim 10, wherein:

said calculating section carries out said conversion based on a capacitor temperature-lifetime law using a detected temperature from said temperature sensor, and said conversion section converts the calculated remaining lifetime into the remaining lifetime in actual use based on a remaining lifetime at another time point at said predetermined temperature and an elapsed time in actual use corresponding to said other time point while using a total remaining lifetime at the initial stage at said predetermined temperature as a reference.

12. The electronic equipment according to claim 11, further comprising means for replacing said initial total remaining lifetime which is a reference of conversion in said converting section by a remaining lifetime at another time point.

13. The electronic equipment according to claim 8, wherein said capacitor is a primary circuit component which is insulated by a transformer, said temperature sensor is a part incorporated in a secondary circuit, an insulating tape is wound around said temperature sensor, and said temperature sensor is brought into tight contact with said capacitor.

14. The electronic equipment according to claim 13, wherein:

said temperature sensor around which said insulting tape is wound and said capacitor are accommodated in a heat-shrinkable tube and are integrally formed together, and said temperature sensor is connected to said calculating means through a lead wire.

15. The electronic equipment according to claim 8, wherein said informing means can switch indication manners of the calculated remaining lifetime between character indication and numerical value indication.

16. The electronic equipment according to claim 8, wherein:

said calculating means includes a deterioration degree calculating section for calculating a rate of the remaining lifetime at the predetermined temperature calculated by said calculating section to the initial total remaining lifetime at said predetermined temperature, and said informing means indicate said calculated deterioration degree.

17. The estimating method of a remaining lifetime according to claim 4, comprising detecting a temperature of the capacitor using a structure wherein an insulating tape is wound around a temperature sensor which detects a temperature of said capacitor and is also used to bring said temperature sensor into tight contact with said capacitor.

18. The estimating method of a remaining lifetime according to claim 17, wherein said temperature sensor around which said insulating tape is wound and said capacitor, are accommodated in a heat-shrinkable tube and are integrally connected together.

19. The estimating method of a remaining lifetime according to claim 17, wherein said capacitor is a primary circuit component which is insulated by a transformer, said temperature sensor is a part incorporated in a secondary circuit, and said temperature sensor is connected to said secondary circuit through a lead wire.

20. An electronic equipment having capacitor, comprising:

a temperature sensor for detecting a temperature of said capacitor, a circuit arrangement which calculates the remaining lifetime of said capacitor using a detected temperature from said temperature sensor, a circuit arrangement which converts the calculated remaining lifetime into a remaining lifetime in actual use, and a circuit arrangement which informs the calculated remaining lifetime, wherein said circuit arrangement which calculates the remaining life time includes a calculating section for calculating the remaining lifetime at a predetermined temperature in accordance with an arithmetic expression based on a capacitor temperature-lifetime law.

21. The electronic equipment according to claim 20, wherein:

said circuit arrangement for calculating the remaining life time calculates the remaining lifetime of said capacitor in actual use, and said circuit arrangement which converts the calculated remaining lifetime includes a converting section for converting the remaining lifetime at the predetermined temperature calculated by said calculating section into the remaining lifetime in actual use.

22. The electronic equipment according to claim 21, wherein:

said circuit arrangement for calculating the remaining life time calculates the remaining lifetime of said capacitor in actual use whenever a predetermined time is elapsed, said calculating section converts said predetermined time elapse in actual use into an elapsed time at said predetermined temperature and subtracts the converted value from the remaining lifetime, and said converting section converts based on a proportional relation between the remaining lifetime at said predetermined temperature and the remaining lifetime in actual use.

23. The electronic equipment according to claim 22, wherein:

said calculating section carries out said conversion based on a capacitor temperature-lifetime law using a detected temperature from said temperature sensor, and said conversion section converts the calculated remaining lifetime into the remaining lifetime in actual use based on a remaining lifetime at another time point at said predetermined temperature and an elapsed time in actual use corresponding to said other time point while using a total remaining lifetime at the initial stage at said predetermined temperature as a reference.

24. The electronic equipment according to claim 23, further comprising a circuit arrangement which replaces said initial total remaining lifetime which is a reference of conversion in said converting section by a remaining lifetime at another time point.

25. The electronic equipment according to claim 20, wherein said circuit arrangement which informs the calculated remaining lifetime can switch indication manners of the calculated remaining lifetime between character indication and numerical value indication.

26. The electronic equipment according to claim 20, wherein said circuit arrangement which calculates the remaining lifetime includes a deterioration degree calculating section for calculating a rate of the remaining lifetime at the predetermined temperature calculated by said calculating section to the initial total remaining lifetime at said predetermined temperature, and said circuit arrangement which informs the calculated remaining lifetime indicates said calculated deterioration degree.

* * * * *